United States Patent [19]

Stevens

[11] Patent Number: 5,702,971
[45] Date of Patent: Dec. 30, 1997

[54] SELF-ALIGNED LOD ANTIBLOOMING STRUCTURE FOR SOLID-STATE IMAGERS

[75] Inventor: Eric G. Stevens, Rochester, N.Y.

[73] Assignee: Eastman Kodak Company, Rochester, N.Y.

[21] Appl. No.: 414,545

[22] Filed: Mar. 31, 1995

[51] Int. Cl.$^6$ ............... H01L 31/18; H01L 21/265; H01L 27/00; H01L 21/70
[52] U.S. Cl. .................. 437/53; 437/3; 437/50
[58] Field of Search .................. 437/3, 43, 50, 437/53; 257/223, 224, 229, 230, 231, 232, 233, 243, 247, 248

[56] References Cited

U.S. PATENT DOCUMENTS

| | | | |
|---|---|---|---|
| 4,173,064 | 11/1979 | Farnow | 357/24 |
| 4,362,575 | 12/1982 | Wallace | 357/24 |
| 4,593,303 | 6/1986 | Dyck et al. | 357/24 |
| 4,710,234 | 12/1987 | Blanchard | 437/40 |
| 4,780,424 | 10/1988 | Holler et al. | 437/43 |
| 5,115,458 | 5/1992 | Burkey et al. | 377/58 |
| 5,118,631 | 6/1992 | Dyck et al. | 457/29 |
| 5,130,774 | 7/1992 | Stevens | 357/24 |
| 5,151,380 | 9/1992 | Hynecek | 437/53 |
| 5,349,215 | 9/1994 | Anagnostopoulos | 257/223 |

*Primary Examiner*—Brian Dutton
*Attorney, Agent, or Firm*—James D. Leimbach

[57] ABSTRACT

A self aligned, lateral-overflow drain antiblooming structure that is insensitive to drain bias voltages and therefore has improved insensitivity to process variations. The length of the antiblooming barrier regions are easily adjusted and determined by photolithography. The self aligned, lateral-overflow drain (LOD) antiblooming structure results in a design that saves space, and hence, improves overall sensor performance. In this structure, an antiblooming potential barrier is provided that is smaller (in volts) than the barriers that separate the pixels from one another so that excess charge will flow preferentially into the LOD as opposed to the adjacent pixels.

9 Claims, 3 Drawing Sheets

* THESE REGIONS GET BOTH CCD AND AB BARRIER-REGION IMPLANTS

SELF-ALIGNED LOD ANTIBLOOMING STRUCTURE FOR SOLID-STATE IMAGERS

FIELD OF INVENTION

The present invention relates to antiblooming structures used within solid state image sensors, and more particularly, to the self aligned antiblooming structures.

BACKGROUND OF THE INVENTION

Blooming is a well known phenomenon that occurs in solid-state image sensors when the number of photocarriers generated by the incident radiation exceeds that of the storage capacity of the element, or pixel. These excess carriers then spill over, or "bloom", into adjacent photosites thereby degrading the integrity of the image. Many types of structures have been proposed in the past, such as U.S. Pat. No. 5,130,774 for example, which provide sinks for these excess carriers either laterally or vertically adjacent the photodetector elements. The advantages and disadvantages of both types have also been discussed.

It is important to maintain high quantum efficiency and charge capacity. Therefore, antiblooming structures should not take up so much space that there is a degradation in the quantum efficiency and charge capacity of the device. Many conventional antiblooming structures are inherently subject to level-to-level misalignment. The extra space taken up within these antiblooming structures to allow for the level-to-level misalignment can result in a reduction in performance of the sensor.

Some of the more recent disclosures are contained in U.S. Pat. No. : 5,349,215 issued to Anagnostopoulos et al. (hereinafter referred to as Anagnostopoulos); U.S. Pat. No. 5,130,774 issued to Stevens et al. (hereinafter referred to as Stevens); U.S. Pat. No. 5,118,631 issued to Dyck et al. (hereinafter referred to as Dyck); and U.S. Pat. No. 4,593,303 also issued to Dyck et al. (hereinafter referred to as Dyck "303"); describe relatively modern approaches at antiblooming structure design. Another important factor in the performance of these antiblooming structures is the length (in microns) of the blooming channel's barrier region. The length of the blooming channel's barrier regions in Anagnostopoulos and Stevens, are unaffected by alignment, but they are not self aligned to the drain. The extra amount of area that must be added to compensate for misalignment becomes an important factor for small pixel size devices. Dyck discloses a self aligned structure, but offers little flexibility in adjusting the length of these barrier regions since this length depends on lateral diffusion of the barrier-region implant.

The length of the barrier regions in this structure is only about 0.5 µm. Although this is very short, and therefore conserves the pixel's surface area, it makes the structure susceptible to the so-called DIBL (drain-induced, barrier lowering) effect. This effect can reduce the antiblooming barrier height dramatically thereby resulting in reduced charge capacity and hence, lower dynamic range. This also makes the barrier height sensitive to the LOD voltage. Hence, this voltage may need to be adjusted on a part-to-part basis due to process variations. Also, changing the length of this region requires changing the process (by varying Dt).

As can be seen by the foregoing discussion, there remains a need within the art for an antiblooming structure design that can offer the advantages of self alignment as well as solving the problems associated with short antiblooming barrier lengths.

SUMMARY OF THE INVENTION

It is the object of this invention to solve the above mentioned problems with the prior art. This invention discloses a process for providing a self-aligned, LOD antiblooming structure whose antiblooming barrier height can be set by process (via implantation), and is relatively insensitive to process variations. An extra gate electrode to set the antiblooming barrier height is not required (as with some other disclosures), but may be provided so as to allow for electronic exposure control to use with FT image sensors. The antiblooming overflow channel length is determined photolithographically and is therefore, easily adjusted by layout. The process is simple and compatible with different types of gate dielectrics such as O ($SiO_2$), ON (oxide nitride), or ONO (oxide nitride oxide).

The antiblooming overflow region channel lengths are defined by a first masking layer patterned by standard photolithographic techniques. A second and third masking layer of photoresist are then used to implant the CCD's buried-channel regions and the LOD's n+ drain regions. These three masking layers are subsequently removed, and the CCD processing proceeds in a conventional manner. Optionally, the first masking layer may be left intact and used as gate control for electronic exposure control as mentioned above. In this case, this masking layer is formed from suitable conductive material such as polysilicon, ITO (indium-tin oxide), etc.

It is an object of the invention to provide a method of manufacturing an antiblooming structure for image sensors comprising the steps of:

- providing a semiconductor substrate of a first conductivity type, having an antiblooming channel implant of a second conductivity type opposite the first conductivity type contained on a major surface of the substrate;
- defining, with masking layers, a first pattern and a second pattern, upon the major surface of the substrate, the first pattern covering an antiblooming barrier region, and the second pattern covering a drain region, such that the combination of the first and second patterns leave an exposed area defining a CCD buried channel;
- creating, by masking, a third pattern that exposes only the drain region and portions of the first pattern adjacent to the drain region;
- implanting the drain region with the second conductivity type to form a drain that is self aligned with edges the antiblooming region; and
- creating a gate electrode over the structure.

It is still further an object of the present invention to provide an antiblooming structure for image sensing device comprising:

- a semiconductor substrate of a first conductivity type, having an antiblooming channel implant of a second conductivity type opposite the first conductivity type contained on a major surface of the substrate;
- a buried channel implant formed adjacent to, and self aligned with, at least one edge of an antiblooming barrier region;
- a drain formed adjacent the antiblooming barrier region such that it is self aligned with at least one edge of the barrier region; and
- at least one gate electrode over the structure.

The above and other objects of the present invention will become more apparent when taken in conjunction with the following description and drawings wherein like characters indicate like parts and which drawings form a part of the present invention.

ADVANTAGEOUS EFFECT OF THE INVENTION

This disclosure describes a self-aligned, lateral-overflow drain antiblooming structure that is insensitive to drain bias voltages and offers improved insensitivity to process variations. The length of the antiblooming barrier regions are easily adjusted and determined by photolithography. The self-alignment feature of this invention improves the quantum efficiency, charge capacity, and dynamic range of the imager for a given pixel size. Also, this LOD antiblooming structure does not require any exotic processing technology. Therefore, this device is highly manufacturable.

DETAILED DESCRIPTION OF THE INVENTION

Figure 5:
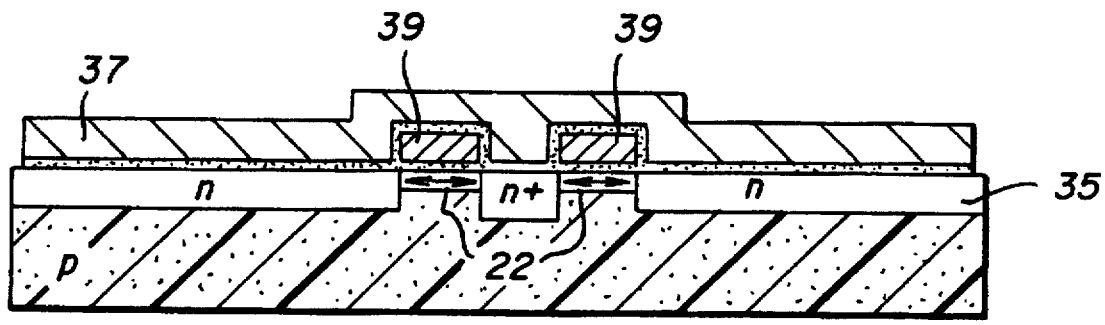
FIG. 5 is a cross section of the completed CCD device of the second embodiment of this invention.
Figure 6:
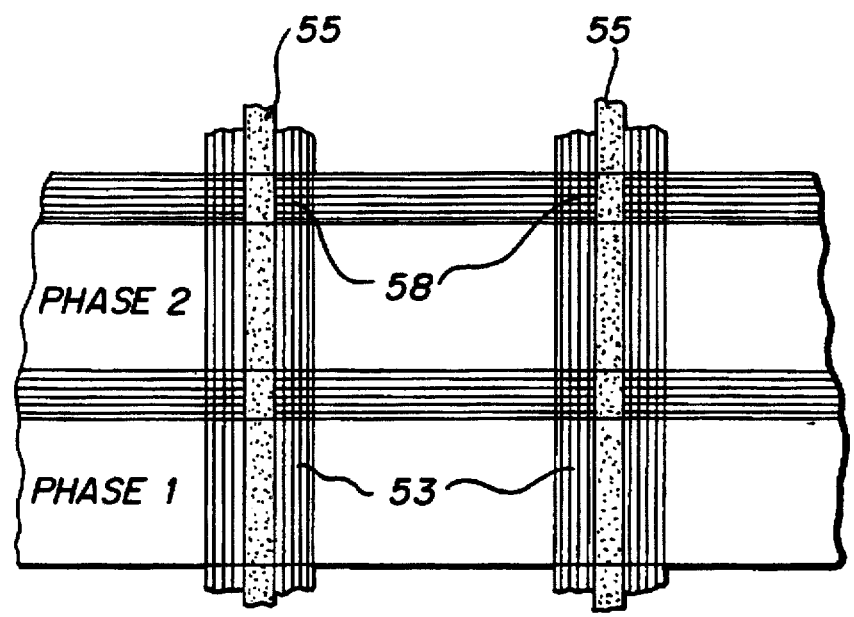
FIG. 6 is a top view of a completed device showing antiblooming barrier regions under both phases of an implanted-barrier, true-two-phase CCD.
Figure 7:
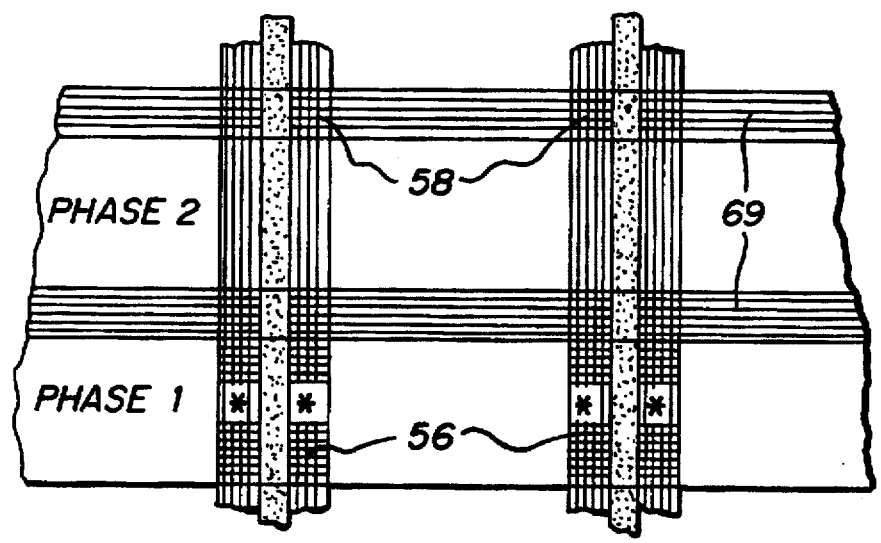
FIG. 7 is a top view of a completed device showing antiblooming barrier regions under only one phase of an implanted-barrier, true-two-phase CCD.

FIGS. 1 through 4 show a process by which the first embodiment of the invention is manufactured. Although these figures show a n-type buried channel CCD, a p-type channel CCD could just as easily be formed by reversing the conductivity type of the appropriate layers as would be apparent to one skilled in the art. FIG. 5 shows a second embodiment wherein electronic exposure control is provided. FIGS. 6 and 7 are top views of the device.

Figure 1:
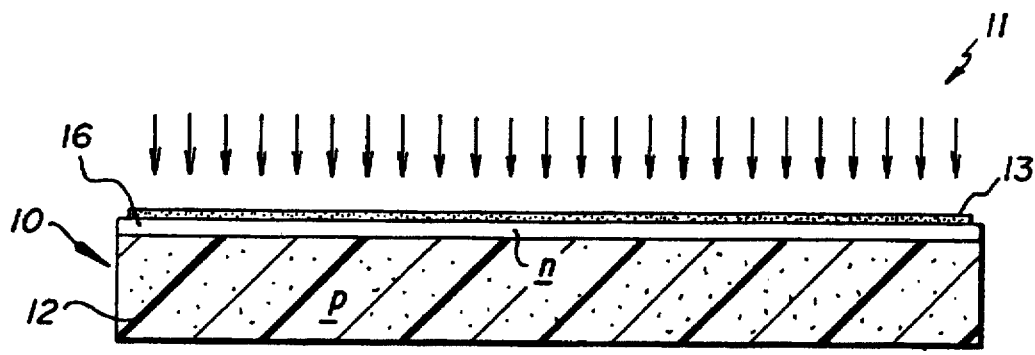
FIG. 1 is a cross section view through the layers used to construct a CCD channel and antiblooming structure.
Figure 2:
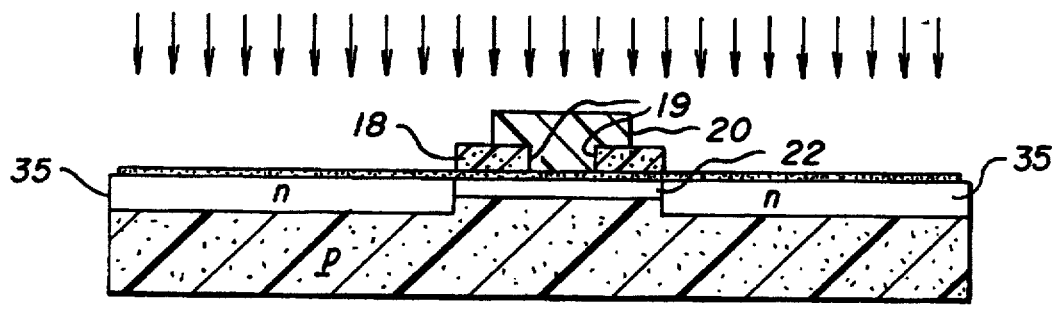
FIG. 2 is a cross section of the invention after the first masking layer and second masking layer have been patterned, and the n-type buried channel has been implanted.
Figure 3:
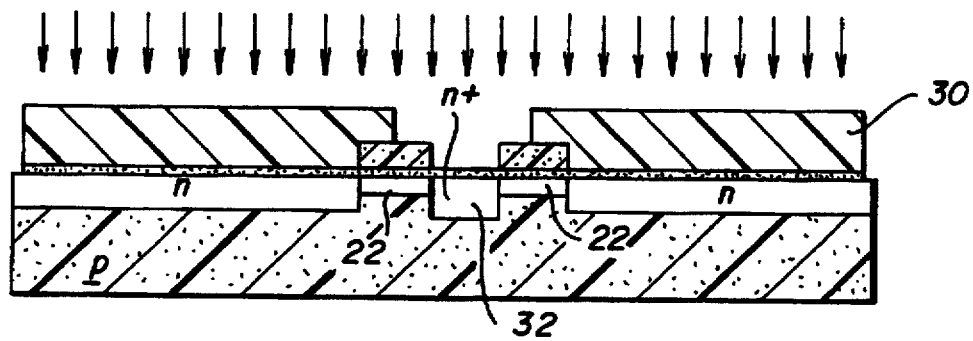
FIG. 3 is a cross section of the CCD according to the present invention after the second masking layer 20 has been removed and the third masking layer 30 has been deposited and patterned.
Figure 4:
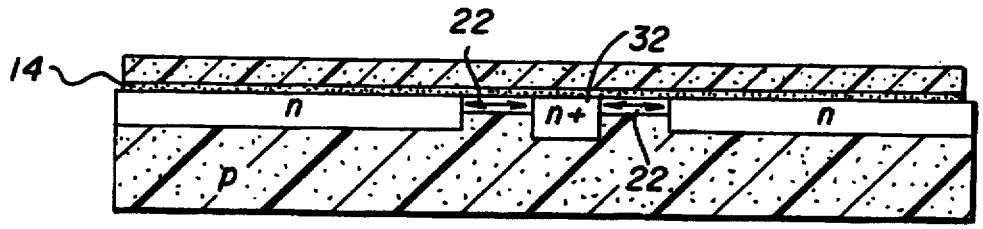
FIG. 4 is a cross section of the CCD illustrating the completed device of the first embodiment of this invention.

Referring to FIGS. 1 through 4, a cross section view through the layers used to construct a CCD channel and antiblooming structure, a p-type substrate 12 is provided with an n-type antiblooming channel implant 16 on a major surface 11 of CCD 10. The uniform, n-type, antiblooming channel implant 16 as shown, along with the gate dielectric 14 thickness and substrate doping, sets the channel potential of this region. FIG. 4 shows gate dielectric 14 where FIG. 1 illustrates an oxide layer 13 (which can be ONO or other oxide material) that could be used as the final gate dielectric 14, the choice of a new gate dielectric layer 14 is a design option. Note that although the substrate is shown as p-type, the invention may be formed in a substrate with or without one or more epitaxial layers and with or without one or more wells as would be obvious to one skilled in the art.

Referring now to FIG. 2, a cross section of the invention at a point in the process after the first masking layer 18 and second masking layer 20 have been deposited and patterned, after which the CCD 10 has an n-type buried channel 35 implanted. The channel potential of the portion of the CCD 10 that has n-type buried channel 35 implanted upon the n-type antiblooming implant 16, as shown, would thus be determined by the summation of the doping levels of the n-type buried channel 35 implant with the doping level of the antiblooming barrier region 16 implant. Therefore, the antiblooming barrier height is determined by the potential difference between the antiblooming barrier height and that of the buried-channel implant.

It should be noted that the buried channel implant 35 is self-aligned to the outside edges of the first masking layer 18 and is therefore, self aligned to the antiblooming barrier region 22 as defined by the regions in the substrate underneath the first masking layers.

The first masking layer 18 may be formed from either: $Si_3N_4$; polysilicon; ITO; WSi; or other conventional masking materials. However, a conductive material is required for this first masking layer if it is to remain as a gate electrode for electronic exposure control, as will be discussed below in the second embodiment of this invention as seen in FIG. 5. The first masking layer 18 allows the implanting of the buried channel 35 such that it is self aligned to the antiblooming barrier region 16.

The second masking layer 20 is preferably made of photoresist material and is used to mask the area of the antiblooming structure that is later identified as the drain region. The dielectric layer 14 on the surface of the single crystal silicon substrate may be a simple oxide, or some other typical dielectric materials such as ON or ONO. Additionally, layer 13 may be used as the final gate dielectric, or it may be etched off and replaced with another dielectric layer(s) later on in the process as would be obvious to one skilled in the art.

Referring to FIG. 3, which is a cross section of the CCD 10 according to the present invention at a point in the process after the second masking layer 20 has been removed and the third masking layer 30 has been deposited and patterned. This third masking layer 30 is preferably photoresist material. The n+ drain of the lateral overflow drain (LOD) 32 structure is then implanted within the space between the first and third masking layers (18, and 30). The LOD 32 is, therefore, inherently self aligned to the inner edges 19 of the first masking layer 18. This results in an LOD 32 structure that is self aligned to the antiblooming barrier regions 22. It should be noted at this point that the order in which the n+ LOD 32 and CCD buried-channel 35 implants are done could be reversed, and that this would be an obvious variation to those skilled in the art.

Referring to FIG. 4, which is a cross section of the CCD 10 illustrating the completed device of the first embodiment of this invention. Other overlayers such as interconnect isolation layers, light-shield layers, passivation layers, and/or color filter arrays (CFAs) are not shown. The gate electrode 37 of the CCD 10 is preferably some transparent, conductive material such as polysilicon or ITO. It should be understood the use of substrates either with or without epitaxial layers, or with or without wells are obvious variations of the embodiments disclosed herein.

Referring to FIG. 5, which is a cross section of the completed CCD 10 device of the second embodiment of this invention, wherein the first masking layer 18 is formed of a conductive material that is left on the device to act as a gate electrode 39 for electronic exposure control within a frame-transfer device.

FIG. 6 is a top view of a completed device showing antiblooming barrier regions under both phases of an implanted-barrier, true-two-phase CCD. Note the isolation regions 58 that prevent inadvertent transfer of charge to the LOD 55 during normal, CCD readout. Since these regions receive the antiblooming channel and CCD barrier region implants, the channel potential of each of these regions is lower than any other region within the structure, thereby providing isolation.

Referring now to FIG. 7, which is an alternate configuration to which the present invention can be employed, wherein only one phase (phase 2 in this case) has an antiblooming channel. This configuration is discussed in U.S. Pat. No. 5,349,215. The blooming channel under phase 1 is eliminated by implanting these regions with both the antiblooming channel implant 53 and CCD barrier region implants 69, thereby effectively turning these regions off (as done to form the CCD-to-LOD isolation regions as discussed above). This has the effect of forcing excess charge into the second phase of the CCD in order for any antiblooming action to take place. The construction of such a device is enhanced via self alignment as taught by the present invention.

Figure 8:
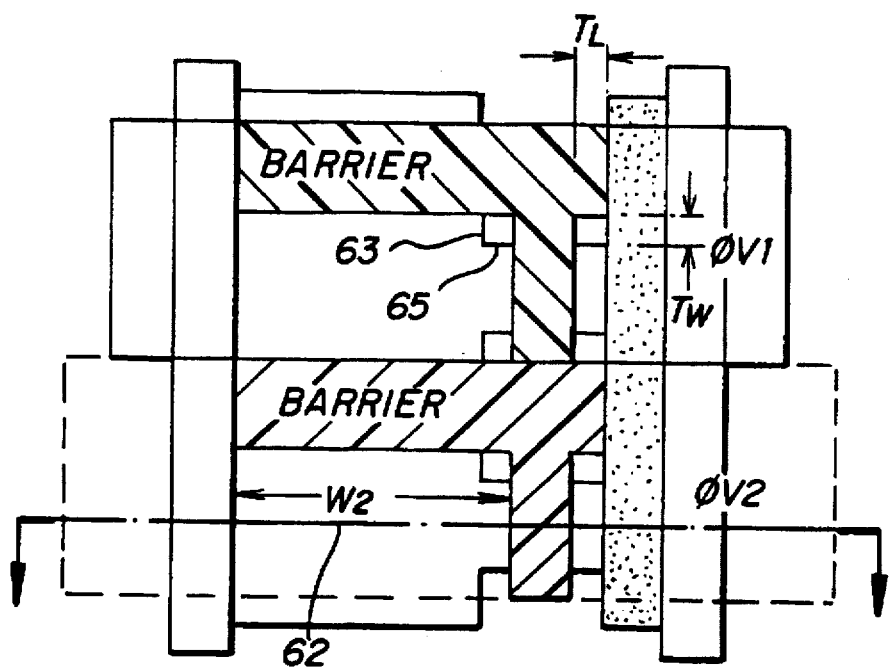
FIG. 8 is a top view of a prior art device having antiblooming barrier regions requiring allowances for length and width alignment tolerances.

Referring to FIG. 8, there are additional advantages of the present invention which will be described further below. The amount of antiblooming protection ($X_{AB}$) can be shown to be given by the relationships below.

$$X_{AB} = 1 + 2\alpha[1 + (W_{AB}L_{CD}/L_{AB}W_{CCD})e^{\delta V/nV_t}] \qquad \text{Equation 1}$$

Where:

α is charge in adjacent, unilluminated pixel as a fraction of charge in the, illuminated pixel at the onset of blooming. (Typically defined to be 0.5);

$W_{AB}$, $L_{AB}$ is the width and length of antiblooming barrier region, respectively;

$W_{CCD}$, $L_{CCD}$ are the width and length of the CCD barrier regions, respectively;

δV is the potential barrier height difference between the antiblooming barrier region and the CCD barrier region;

n is the nonideality factor (typically about 1.0 for LOD structure);

$V_t$ is the thermal voltage, kT/q, equal to approximately 26 mV at room temp.

k is Boltzman's constant.

T is the absolute temperature.

q is the charge of an electron.

Therefore for δV greater than 50 to 75 mV, which represents two to three times kT/q at room temperature, and with α=0.5, $$X_{AB} = (W_{AB}L_{CD}/L_{AB}W_{CCD})e^{\delta V/nV_t} \qquad \text{Equation 2}$$

From the above relationships, it is clearly evident that the amount of blooming protection is proportional to the width of the antiblooming channel and inversely proportional to its length. Prior art devices have alignment tolerances that require spacing. This tolerance space occurs at the expense of space used, otherwise, for antiblooming channel width, for example. These tolerances can be seen in FIG. 8, which is an illustration of a similar device to that of FIG. 6, however the device of 8 is without the self alignment feature of the antiblooming channels taught by the present invention. The width of the antiblooming channel within the relationship indicated by Equation 1 and Equation 2 is W2 (62) on FIG. 8. W2 (62) is narrowed by an amount equal to twice the tolerance width, indicated as $T_w$ (63). This is corrected in the present invention by creating a self aligned antiblooming channel that does not require alignment tolerances. This results in an increase in the width of the antiblooming channel and increased blooming protection. Additionally, improved quantum efficiency and charge capacity results.

Referring once again to the device of FIG. 6 there are isolation regions 58 between phases within the CCD. The isolation regions 58 are constructed to receive both the antiblooming region implants 53 and the CCD barrier region implants 69. The CCD barrier implants are conventionally used to create an implanted barrier two phase device. These isolation regions prevent inadvertent transfer of charge into the LOD during normal charge transfer between phases. These isolation regions are present in the same relative positions under all phases 1 and 2 of the CCD. The self aligned antiblooming regions are naturally employed to construct these isolation regions resulting in self aligned isolation regions.

In the following description, like reference characters designate like or corresponding parts throughout the several views of the drawings. Also in the following description, it is to be understood that such terms as "forward", "rearward", "left", "right", "upwardly", "downwardly", and the like, are words of convenience and are not to be construed as limiting terms.

The invention has been described with reference to a preferred embodiment. However, it will be appreciated that variations and modifications can be effected by a person of ordinary skill in the art without departing from the scope of the invention.

PARTS LIST

10 CCD
12 p-silicon substrate
13 Dielectric layer
14 Dielectric layer
22 Antiblooming barrier region openings
30 Third masking layer
31 LOD implant opening
32 LOD
35 n-type channel
37 gate electrode
42 n-type antiblooming barrier implant
53 Antiblooming barrier region
55 LOD
56 isolation regions
58 isolation regions
62 W2 width of prior art antiblooming channel
63 $T_w$, the antiblooming width tolerance
65 $T_L$, the antiblooming length tolerance
69 CCD barrier region implants

I claim:

1. A method of manufacturing an antiblooming structure for image sensors comprising the steps of:

providing a semiconductor substrate of a first conductivity type, having an antiblooming channel implant of a second conductivity type opposite the first conductivity type on a major surface of the substrate in a laterally uniform manner across a pixel area;

placing a gate oxide upon the surface of the substrate;

defining a first masking pattern and a second masking pattern, upon the gate oxide of the substrate, the first masking pattern covering an antiblooming barrier region, the antiblooming barrier region having an inner edge and an outer edge, and the second masking pattern covering a drain region, such that the combination of the first masking pattern and second masking pattern leave an exposed area defining a CCD buried channel;

implanting within the exposed area of the CCD buried channel a material of the second conductivity type that is self aligned to the outer edges of the first masking layer;

removing the second masking layer that covers the drain region;

creating, by masking, a third pattern that exposes only the drain region and portions of the first pattern adjacent to the drain region;

implanting the drain region with the second conductivity type to form a drain that is self aligned with the inner edges the antiblooming barrier region; and removing remaining portions of the first and the third masking layers; and creating a gate electrode over the substrate.

2. The method of claim 1 wherein the order of implanting the drain region and the buried channel is is arranged such that the steps of creating, by masking, a third pattern and of implanting the drain region are performed before the steps of defining a first masking pattern and the second masking pattern that leaves an exposed area and of implanting within the exposed area of the CCD a material of the second conductivity type.

3. The method of claim 1 wherein the first masking pattern is not removed and is made from a conductive material that functions as the gate electrode.

4. The method of claim 1 wherein the pixel area has a plurality of cells representative of different phases and further comprising the step of creating isolation regions defined at intersections of the antiblooming barrier region with the CCD buried region.

5. The method of claim 4 wherein the step of creating isolation regions further comprises creating isolation regions along the antiblooming barrier region of all but one phase of each the cells of the CCD buried channel.

6. The method of claim 5 wherein the step of creating isolation regions further comprises creating a two-phase CCD with isolation regions being created within one phase of each of the cells of the two-phase CCD.

7. A method of manufacturing an antiblooming structure for image sensors comprising the steps of:

providing a semiconductor substrate of a first conductivity type, having an antiblooming channel implant of a second conductivity type opposite the first conductivity type contained on a major surface of the substrate;

defining a CCD buried channel implant from the second conductivity type around an antiblooming barrier region such that the buried channel implant has at least one self aligned edge with the antiblooming barrier region;

creating a drain region adjacent the antiblooming barrier region such that the drain is self aligned with at least one edge of the antiblooming barrier region; and creating isolation regions defined by the intersection of the antiblooming barrier region with the CCD buried channel along an entire length of the antiblooming barrier region in all but one phase of each cell of the CCD buried channel.

8. The method of claim 7 wherein the defining step defines the antiblooming barrier region that comprises a plurality of spaced areas separated by the drain region.

9. The method of claim 7 wherein the step of creating isolation regions further comprises creating a two-phase CCD with isolation regions being created within one phase of the CCD buried channel.

* * * * *

UNITED STATES PATENT AND TRADEMARK OFFICE
CERTIFICATE OF CORRECTION

PATENT NO. : 5,702,971
DATED : December 30, 1997
INVENTOR(S) : Eric G. Stevens

It is certified that error appears in the above-indentified patent and that said Letters Patent is hereby corrected as shown below:

| | |
|---|---|
| Column 7, Line 18 | Delete the first occurrence of the word "is". |
| Column 7, Line 32 | Replace the word "buried" with the word --barrier--. |
| Column 8, Line 2 | Between the words "each" and "the", insert the word -- of --. |
| Column 8, Line 2 | Delete the words "buried channel". |
| Column 8, Lines 22 and 23 | Delete the words "buried channel" and replace with the words -- barrier region --. |
| Column 8, Line 25 | Delete the words "buried channel". |
| Column 8, Line 32 | Delete the words "buried channel". |

Signed and Sealed this

Thirtieth Day of November, 1999

Attest:

Q. TODD DICKINSON

Attesting Officer

Acting Commissioner of Patents and Trademarks